ян

(12) United States Patent
Kyono et al.

(10) Patent No.: US 9,929,301 B2
(45) Date of Patent: Mar. 27, 2018

(54) SEMICONDUCTOR STACK AND SEMICONDUCTOR DEVICE

(71) Applicant: SUMITOMO ELECTRIC INDUSTRIES, LTD., Osaka-shi, Osaka (JP)

(72) Inventors: Takashi Kyono, Itami (JP); Suguru Arikata, Itami (JP); Katsushi Akita, Itami (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 15/553,213

(22) PCT Filed: Jan. 12, 2016

(86) PCT No.: PCT/JP2016/050649
§ 371 (c)(1),
(2) Date: Aug. 24, 2017

(87) PCT Pub. No.: WO2016/139970
PCT Pub. Date: Sep. 9, 2016

(65) Prior Publication Data
US 2018/0062019 A1  Mar. 1, 2018

(30) Foreign Application Priority Data

Mar. 5, 2015 (JP) .................................. 2015-043396

(51) Int. Cl.
*H01L 33/00* (2010.01)
*H01L 31/10* (2006.01)
(Continued)

(52) U.S. Cl.
CPC ........ *H01L 31/10* (2013.01); *H01L 21/02381* (2013.01); *H01L 21/02433* (2013.01);
(Continued)

(58) Field of Classification Search
CPC ......... H01L 21/02381; H01L 21/02392; H01L 21/02433; H01L 21/02461;
(Continued)

(56) References Cited

U.S. PATENT DOCUMENTS

2012/0034149 A1\* 2/2012 Fujiwara ................. C30B 25/02
423/409
2015/0214307 A1\* 7/2015 Yamaguchi ......... H01L 31/1844
438/45

FOREIGN PATENT DOCUMENTS

JP 2012-9777 A 1/2012

\* cited by examiner

*Primary Examiner* — Brook Kebede
(74) *Attorney, Agent, or Firm* — Drinker Biddle & Reath LLP

(57) ABSTRACT

A semiconductor stack includes a substrate composed of a III-V group compound semiconductor, a buffer layer that is arranged on the substrate and that is composed of a III-V group compound semiconductor, and an active layer that is arranged on the buffer layer and that includes a layer composed of a III-V group compound semiconductor containing Sb as a group V element. A region of the buffer layer including a main surface of the buffer layer adjacent to the substrate includes a high-concentration region having a high total concentration of Si and C compared with another adjacent region.

13 Claims, 10 Drawing Sheets

(51) Int. Cl.
*H01L 25/065* (2006.01)
*H01L 33/34* (2010.01)
*H01L 29/04* (2006.01)
*H01L 21/02* (2006.01)

(52) U.S. Cl.
CPC .... *H01L 21/02505* (2013.01); *H01L 25/0657* (2013.01); *H01L 29/045* (2013.01); *H01L 33/0079* (2013.01); *H01L 33/346* (2013.01); H01L 21/02395 (2013.01); H01L 2924/10253 (2013.01)

(58) Field of Classification Search
CPC ......... H01L 21/02463; H01L 21/02505; H01L 21/02546; H01L 21/02576; H01L 21/30604; H01L 25/0657; H01L 29/045; H01L 29/7785; H01L 31/03042; H01L 31/03046; H01L 31/10; H01L 31/1844; H01L 31/1075; H01L 33/0079; H01L 33/346
USPC .................................................. 257/77–103
See application file for complete search history.

SEMICONDUCTOR STACK AND SEMICONDUCTOR DEVICE

TECHNICAL FIELD

The present invention relates to a semiconductor stack and a semiconductor device.

BACKGROUND ART

A semiconductor stack including a structure in which an active layer containing antimony (Sb) as a group V element is arranged on a substrate composed of a III-V group compound semiconductor can be used for the production of a semiconductor device such as a light-receiving device sensitive to mid-infrared light. Specifically, for example, an infrared light-receiving device can be produced by using the active layer as a light-receiving layer, forming a contact layer on the light-receiving layer, and forming appropriate electrodes. To achieve a good crystallinity of the active layer, which has a potent influence on the performance of the light-receiving device, a buffer layer serving as an underlying layer of the light-receiving layer needs to have a good surface flatness.

A method for forming a semiconductor layer having good surface properties on a substrate that has a main surface inclined with respect to a crystal plane with a predetermined plane direction, i.e., an off-axis substrate, is reported (for example, see PTL 1).

CITATION LIST

Patent Literature

PTL 1: Japanese Unexamined Patent Application Publication No. 2012-9777

SUMMARY OF INVENTION

Technical Problem

As described above, the formation of a semiconductor layer that is composed of a III-V group compound semiconductor and that has a good surface flatness is one of the important challenges in the production of a semiconductor device such as a light-receiving device for infrared radiation.

It is an object of the present invention to provide a semiconductor stack having a structure in which a buffer layer that has a good surface flatness and that is composed of a III-V group compound semiconductor is arranged on a substrate composed of a III-V group compound semiconductor, and a semiconductor device.

Solution to Problem

A semiconductor stack according to the present invention includes a substrate composed of a III-V group compound semiconductor, a buffer layer arranged on the substrate, the buffer layer being composed of a III-V group compound semiconductor, and an active layer arranged on the buffer layer, the active layer including a layer composed of a III-V group compound semiconductor containing Sb as a group V element. A region of the buffer layer including a main surface of the buffer layer adjacent to the substrate includes a high-concentration region having a high total concentration of Si (silicon) and C (carbon) compared with another adjacent region.

Advantageous Effects of Invention

With regard to the semiconductor stack, it is possible to provide the semiconductor stack having a structure in which the buffer layer that has a good surface flatness and that is composed of the III-V group compound semiconductor is arranged on the substrate composed of the III-V group compound semiconductor.

DESCRIPTION OF EMBODIMENTS OF INVENTION

[Description of Embodiments of Invention]

Figure 1:
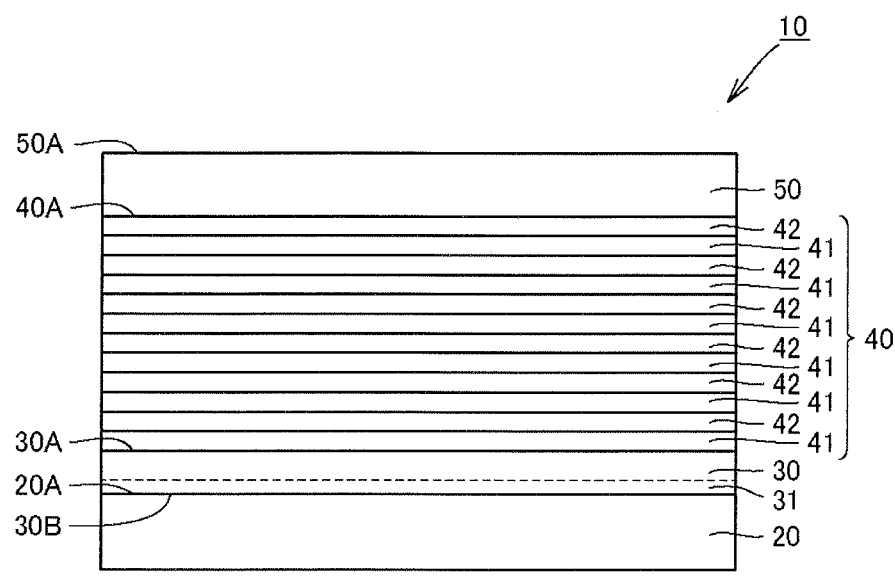
FIG. 1 is a schematic cross-sectional view of a structure of a semiconductor stack according to a first embodiment.

Embodiments of the present invention are first listed and explained. A semiconductor stack of the present invention includes a substrate composed of a III-V group compound semiconductor, a buffer layer that is arranged on the substrate and that is composed of a III-V group compound semiconductor, and an active layer that is arranged on the buffer layer and that includes a layer composed of a III-V group compound semiconductor containing Sb as a group V element. A region of the buffer layer including a main surface of the buffer layer adjacent to the substrate includes a high-concentration region having a high total concentration of Si and C compared with another adjacent region.

The inventors have conducted studies on a method for forming a buffer layer that has a good surface flatness and that is composed of a III-V group compound semiconductor on a substrate composed of a III-V group compound semiconductor.

The inventors have found that when a buffer layer is formed on the substrate, a good surface flatness of the buffer layer can be achieved by forming the buffer layer while a high-concentration region having a high total concentration of Si and C compared with another adjacent region is formed in a region of the buffer layer including a main surface of the buffer layer adjacent to the substrate.

In the semiconductor stack of the present application, the high-concentration region having a high total concentration of Si and C compared with another adjacent region is arranged in the region of the buffer layer including the main surface of the buffer layer adjacent to the substrate. This results in a good surface flatness of the buffer layer. Thus, according to the semiconductor stack of the present application, it is possible to provide the semiconductor stack having the structure in which the buffer layer that has a good surface flatness and that is composed of a III-V group compound semiconductor is formed on the substrate composed of a III-V group compound semiconductor.

In the semiconductor stack, the high-concentration region may have a total concentration of Si and C of $5 \times 10^{18}$ cm$^{-3}$ or more. In this case, the buffer layer can more reliably have a good surface flatness.

In the semiconductor stack, the high-concentration region may have a Si concentration of $5 \times 10^{18}$ cm$^{-3}$ or more. A concentration of Si, which is particularly highly effective in improving the surface flatness of the buffer layer, of $5 \times 10^{18}$ cm$^{-3}$ or more can result in the buffer layer more reliably having a good surface flatness.

In the semiconductor stack, the high-concentration region may have a total concentration of Si and C of $5 \times 10^{20}$ cm$^{-3}$ or less. When the high-concentration region has a total concentration of Si and C of more than $5 \times 10^{20}$ cm$^{-3}$, the high-concentration region can have degraded crystallinity. When the high-concentration region has a total concentration of Si and C of $5 \times 10^{20}$ cm$^{-3}$ or less, the buffer layer can more reliably have a good surface flatness.

In the semiconductor stack, the high-concentration region may have a thickness of 2 nm or more and 50 nm or less. A thickness of the high-concentration region of less than 2 nm can fail to sufficiently provide the effect of improving the surface flatness. A thickness of the high-concentration region of more than 50 nm can result in a decrease in the crystallinity of the high-concentration region. When the high-concentration region has a thickness of 2 nm or more and 50 nm or less, the buffer layer can more reliably have a good surface flatness.

In the semiconductor stack, a region of the substrate including a main surface of the substrate adjacent to the buffer layer may include an oxidized region having a high oxygen concentration compared with another adjacent region of the substrate. In the semiconductor stack of the present invention, even if the oxidized region is present on the main surface of the substrate, it is possible to provide the semiconductor stack having the structure in which the buffer layer that has a good surface flatness and that is composed of a III-V group compound semiconductor is arranged on the substrate composed of a III-V group compound semiconductor.

In the semiconductor stack, the oxidized region may have an oxygen concentration of $1 \times 10^{18}$ cm$^{-3}$ or more and $1 \times 10^{21}$ cm$^{-3}$ or less. In the semiconductor stack of the present invention, even if the oxidized region having the oxygen concentration is arranged, it is possible to provide the semiconductor stack having the structure in which the buffer layer that has a good surface flatness and that is composed of a III-V group compound semiconductor is arranged on the substrate composed of a III-V group compound semiconductor.

In the semiconductor stack, a degree of lattice mismatch between the substrate and a region of the buffer layer other than the high-concentration region of the buffer layer may be 0.2% or less. In this case, three-dimensional growth is inhibited in the formation of the buffer layer, so that a good surface flatness is easily provided.

In the semiconductor stack, the substrate and the buffer layer may be composed of an identical group compound semiconductor. In this case, a good surface flatness is easily provided.

In the semiconductor stack, the group compound semiconductor contained in the substrate and the buffer layer may be GaSb (gallium antimonide), InP (indium phosphide), GaAs (gallium arsenide), or InAs (indium arsenide). Of these, GaSb and InP are suitable as materials of a substrate and a buffer layer for a semiconductor stack used in the production of a light-receiving device sensitive to infrared light.

In the semiconductor stack, the active layer may have a quantum well structure. The arrangement of the quantum well structure on the buffer layer having a good surface flatness easily results in the improved surface flatness and interface steepness of the quantum well structure. Thus, for example, when the semiconductor stack is used for the production of a light-receiving device, it is possible to produce a high-sensitivity light-receiving device.

In the semiconductor stack, the buffer layer may be formed by a metal-organic vapor deposition method. A crystal growth temperature in the metal-organic vapor deposition method is higher than that by, for example, a molecular beam epitaxy (MBE) method. This facilitates the migration of atoms during crystal growth and thus facilitates the achievement of a good surface flatness.

A semiconductor device of the present application includes the semiconductor stack and an electrode arranged on the semiconductor stack. The semiconductor device of the present invention includes the semiconductor stack including the buffer layer having a good surface flatness.

According to the semiconductor stack of the present application, it is thus possible to provide a high-performance semiconductor device.

[Details of Embodiments of the Invention]

First Embodiment

A first embodiment, which is an embodiment of a semiconductor stack according to the present invention, will be described below with reference to the drawings. In the drawings, the same or equivalent portions are designated using the same reference numerals, and descriptions are not redundantly repeated.

As illustrated in FIG. 1, a semiconductor stack 10 according to this embodiment includes a substrate 20, a buffer layer 30, a quantum well structure 40 serving as an active layer, and a contact layer 50.

The substrate 20 is composed of a III-V group compound semiconductor. The substrate 20 has a diameter of 50 mm or more and, for example, 3 inches. As the III-V group compound semiconductor contained in the substrate 20, for example, GaSb, InP, InAs (indium arsenide), or GaAs (gallium arsenide) may be used. By using the substrate 20 composed of any one of these III-V group compound semiconductors, the semiconductor stack 10 appropriate for the production of a light-receiving device for mid-infrared light can be produced. Specifically, for example, GaSb of an n-conductivity type (n-GaSb) is used as a compound semiconductor constituting the substrate 20. As an n-type impurity contained in the substrate 20, for example, Te (tellurium) can be used. The substrate 20 can have a diameter of 80 mm or more (for example, 4 inches), 105 mm or more (for example, 5 inches), or 130 mm or more (for example, 6 inches) in order to improve the production efficiency and yield of a semiconductor device including the semiconductor stack 10.

The buffer layer 30 is a semiconductor layer in contact with one main surface 20A of the substrate 20. The buffer layer 30 is composed of a III-V group compound semiconductor. The III-V group compound semiconductor contained in the buffer layer 30 may contain Sb serving as a group V element. It is difficult to form a buffer layer that contains Sb as a group V element and that has a good surface flatness. Thus, the present invention is particularly beneficial to such a buffer layer. As the III-V group compound semiconductor contained in the buffer layer 30, for example, a binary-system material such as GaSb, AlSb (aluminum antimonide), or InSb (indium antimonide) or a ternary-system material such as GaInSb (gallium indium antimonide), AlInSb (aluminum indium antimonide), or AlGaSb (aluminum gallium antimonide) can be used. Specifically, for example, GaSb of a p-conductivity type (p-GaSb) is used as a compound semiconductor contained in the buffer layer 30. As a p-type impurity contained in the buffer layer 30, for example, C (carbon), Zn (zinc), or Be (beryllium) can be used.

The quantum well structure 40 is in contact with a first main surface 30A of the buffer layer 30 opposite the surface in contact with the substrate 20. The quantum well structure 40 has a structure in which two element layers composed of a III-V group compound semiconductor are alternately stacked. More specifically, the quantum well structure 40 has a structure in which a first element layer 41 and a second element layer 42 are alternately stacked. As a material contained in the first element layer 41, for example, InAs can be used.

As a material contained in the second element layer 42, for example, GaSb, which contains Sb as a group V element, can be used. When the semiconductor stack 10 is used for the production of a light-receiving device, the quantum well structure 40 preferably has a thickness of 500 nm or more. In this case, the sensitivity of the light-receiving device produced with the semiconductor stack 10 can be improved.

Each of the first element layer 41 and the second element layer 42 may have a thickness of 3 nm. The quantum well structure 40 may have a structure in which 100 unit structures each formed of the first element layer 41 and the second element layer 42 are stacked. That is, the quantum well structure 40 may have a thickness of, for example, 600 nm. The quantum well structure 40 may be a type-II quantum well having the structure.

The quantum well structure 40 including InAs layers and GaSb layers alternately stacked is suitable as a light-receiving layer for mid-infrared light. The use of the structure can result in the semiconductor stack 10 appropriate for the production of a light-receiving device for mid-infrared light. The combination of the III-V group compound semiconductors contained in the first element layer 41 and the second element layer 42 is not limited thereto. For example, the combination of GaSb and InAsSb (indium arsenic antimonide) or the combination of GaInSb and InAs may be used. To make compensation for the strain of the quantum well structure 40, the unit structure of the quantum well structure 40 may further include a strain compensation layer in addition to the first element layer 41 and the second element layer 42. As the strain compensation layer, for example, an InSbAs (indium antimony arsenide) layer, an InSb layer, or a GaInSb layer may be used. Although the active layer has the quantum well structure 40 in the embodiment, a single III-V group compound semiconductor layer may also be used in place of this.

As the single III-V group compound semiconductor layer, for example, an InSb layer, an InAs layer, a GaInSb layer, or an AlInSb layer may be used.

As illustrated in FIG. 1, the contact layer 50 is in contact with a main surface 40A of the quantum well structure 40 opposite the side in contact with the buffer layer 30. The contact layer 50 is composed of a III-V group compound semiconductor.

As the III-V group compound semiconductor contained in the contact layer 50, for example, InAs, GaSb, GaAs, InP, or InGaAs (indium gallium arsenide) can be used. Specifically, for example, InAs of an n-conductivity type (n-InAs) is used as a compound semiconductor contained in the contact layer 50. As an n-type impurity contained in the contact layer 50, for example, Te or Si can be used.

In the semiconductor stack 10 according to the embodiment, a region of the buffer layer 30 including a second main surface 30B, which is a main surface adjacent to the substrate 20, includes a high-concentration region 31 having a high total concentration of Si and C compared with another adjacent region. This results in the buffer layer 30 having a good surface flatness (i.e., flatness of the first main surface 30A). The arrangement of the quantum well structure 40 on the buffer layer 30 having a good surface flatness easily results in the improved surface flatness and interface steepness of the quantum well structure 40. Thus, when the semiconductor stack 10 is used for the production of a light-receiving device, it is possible to produce a high-sensitivity light-receiving device.

As described below, considering that the semiconductor stack 10 is used for the production of an infrared light-receiving device, the following structure is preferred because carriers are efficiently taken: A first electrode is in contact with the contact layer 50 of an n-conductivity type. A region of a p-conductivity type is arranged on the opposite side of the contact layer 50 with respect to the quantum well structure 40. A second electrode is in contact with the region. However, for example, in the case where the substrate 20 is composed of GaSb and where the substrate 20 contains Zn as an impurity and thus has a p-conductivity type, the absorption of incident infrared light is increased; thus, the conductivity type of the substrate 20 is preferably an n-type. Accordingly, the following structure is appropriately used: The buffer layer 30 of a p-conductivity type is used. Part of the buffer layer 30 is exposed by, for example, etching. A second electrode is in contact with the buffer layer is appropriately used. In this case, when an impurity introduced to form the high-concentration region 31 in the buffer layer 30 is an n-type impurity, the buffer layer 30 is partially depleted to narrow a current path, which is not preferred. When an impurity introduced to form the high-concentration region 31 is a p-type impurity, a wide current path is provided, which is preferred. Si and C each function as a p-type impurity in the buffer layer 30 composed of GaSb. Also from this point of view, the formation of the high-concentration region 31 having a high total concentration of Si and C is preferred.

In the semiconductor stack 10, the total concentration of Si and C in the high-concentration region 31 is preferably $5\times10^{18}$ cm$^{-3}$ or more. In this case, the buffer layer 30 can more reliably have a good surface flatness. The concentration of Si in the high-concentration region 31 is preferably $5\times10^{18}$ cm$^{-3}$ or more. In this case, the buffer layer 30 can more reliably have a good surface flatness. The total concentration of Si and C in the high-concentration region 31 is preferably $5\times10^{20}$ cm$^{-3}$ or less. In this case, the degradation of the crystallinity of the high-concentration region 31 can be avoided, and the buffer layer 30 can more reliably have a good surface flatness. The high-concentration region 31 preferably has a thickness of 2 nm or more and 50 nm or less.

In this case, a decrease in the crystallinity of the high-concentration region 31 can be avoided while ensuring the effect of the high-concentration region 31 on an improvement in surface flatness.

A region of the substrate 20 including the one main surface 20A may include an oxidized region having a high oxygen concentration compared with another adjacent region of the substrate 20. Even in this case, the arrangement of the high-concentration region 31 in the buffer layer 30 enables the buffer layer 30 to have a good surface flatness. The oxidized region may have an oxygen concentration of $1\times10^{18}$ cm$^{-3}$ or more and $1\times10^{21}$ cm$^{-3}$ or less. Even if the oxidized region having the oxygen concentration is arranged, the arrangement of the high-concentration region 31 in the buffer layer 30 enables the buffer layer 30 to have a good surface flatness.

A degree of lattice mismatch between the substrate 20 and a region of the buffer layer 30 other than the high-concentration region 31 is preferably 0.2% or less. In this case, three-dimensional growth is inhibited in the formation of the buffer layer 30, so that a good surface flatness is easily provided. The substrate 20 and the buffer layer 30 are preferably composed of an identical III-V group compound semiconductor. In this case, a good surface flatness is easily provided. The III-V group compound semiconductor contained in the substrate 20 and the buffer layer 30 may be GaSb, InP, GaAs, or InAs. Of these, GaSb and InP are suitable as materials of a substrate and a buffer layer for a semiconductor stack used in the production of a light-receiving device sensitive to infrared light. When the substrate 20 composed of GaSb is used, an oxide film (oxidized region) is easily formed on the one main surface 20A of the substrate 20. Even when the oxidized region is arranged on the one main surface 20A of the substrate 20, the arrangement of the high-concentration region 31 in the buffer layer 30 enables the buffer layer 30 to have a good surface flatness.

The buffer layer 30 is preferably formed by a metal-organic vapor deposition method. The formation of the buffer layer 30 by the metal-organic vapor deposition method facilitates the migration of atoms during crystal growth and thus facilitates the achievement of a good surface flatness.

Figure 2:
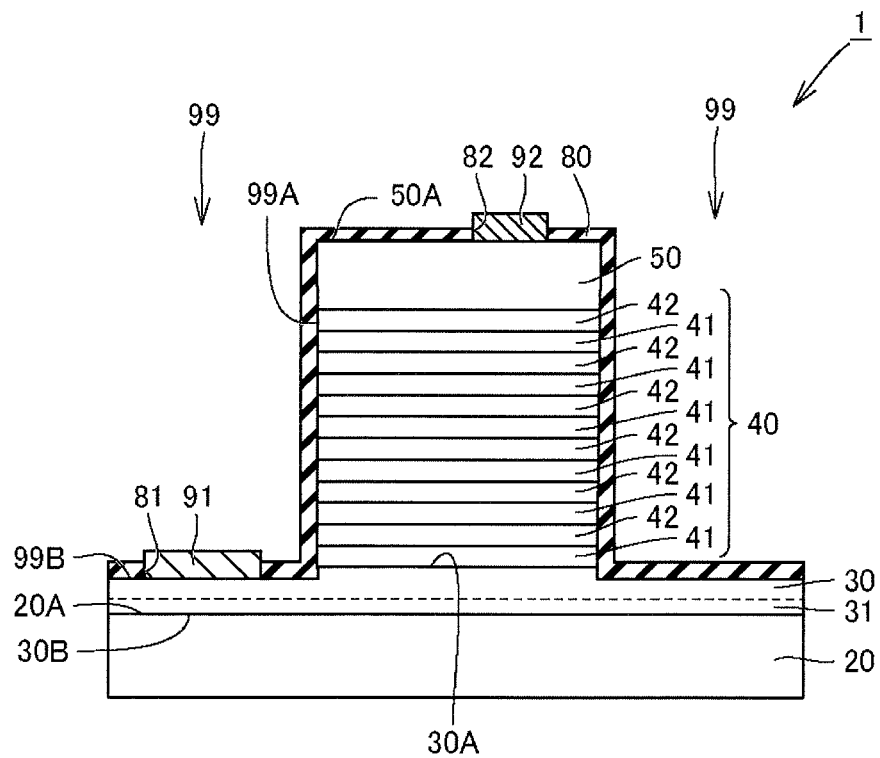
FIG. 2 is a schematic cross-sectional view of a structure of a light-receiving device according to the first embodiment.

An infrared light-receiving device (photodiode), which is an example of a semiconductor device including the semiconductor stack 10, will be described below. As illustrated in FIG. 2, an infrared light-receiving device 1 according to the embodiment is produced by using the foregoing semiconductor stack 10 according to the embodiment and includes the substrate 20, the buffer layer 30, the quantum well structure 40, and the contact layer 50, which are stacked similarly to the semiconductor stack 10. The infrared light-receiving device 1 includes trenches 99 each extending through the contact layer 50 and the quantum well structure 40 to the buffer layer 30. The contact layer 50 and the quantum well structure 40 are exposed at side walls 99A of the trenches 99. Bottom walls 99B of the trenches 99 are located in the buffer layer 30. That is, the buffer layer 30 is exposed at the bottom walls 99B of the trenches 99.

The infrared light-receiving device 1 further includes a passivation film 80, a p-side electrode 91, and an n-side electrode 92. The passivation film 80 covers the bottom walls 99B of the trenches 99, the side walls 99A of the trenches 99, and a main surface 50A of the contact layer 50 opposite the side facing the quantum well structure 40. The passivation film 80 is composed of an insulating material such as silicon nitride or silicon oxide.

An opening portion 81 is arranged in the passivation film 80 that covers the bottom walls 99B of the trenches 99 and extends through the passivation film 80 in the thickness direction. The opening portion 81 is filled with the p-side electrode 91. The p-side electrode 91 is in contact with the buffer layer 30 exposed at the opening portion 81. The p-side electrode 91 is composed of a conductive material such as a metal. More specifically, the p-side electrode 91 may be composed of, for example, Ti (titanium)/Pt (platinum)/Au (gold). The p-side electrode 91 forms an ohmic contact with the buffer layer 30.

An opening portion 82 is arranged in the passivation film 80 that covers the main surface 50A of the contact layer 50 and extends through the passivation film 80 in the thickness direction. The opening portion 82 is filled with the n-side electrode 92. The n-side electrode 92 is in contact with the contact layer 50 exposed at the opening portion 82. The n-side electrode 92 is composed of a conductive material such as a metal. More specifically, the n-side electrode 92 may be composed of, for example, Ti/Pt/Au. The n-side electrode 92 forms an ohmic contact with the contact layer 50.

When infrared light is incident on the infrared light-receiving device 1, the infrared light is absorbed between quantum levels in the quantum well structure 40, generating electron-hole pairs. The generated electrons and holes are taken from the infrared light-receiving device 1 as photocurrent signals. Thus, infrared light is detected.

The n-side electrode 92 is a pixel electrode. As illustrated in FIG. 2, the infrared light-receiving device 1 may include only a single n-side electrode 92 serving as a pixel electrode or may include a plurality of pixel electrodes (n-side electrodes 92). Specifically, the infrared light-receiving device 1 may have a structure in which unit structures each illustrated in FIG. 2 are arranged in directions in which the one main surface 20A of the substrate 20 extends in FIG. 2. In this case, although the infrared light-receiving device 1 includes the n-side electrodes 92 corresponding to the pixels, only a single p-side electrode 91 is arranged. This structure will be described in a second embodiment below.

The infrared light-receiving device 1 according to the embodiment has a structure in which the quantum well structure 40 serving as a light-receiving layer is arranged on the buffer layer 30 having a good surface flatness. This results in a good quality of a periodic structure such as the interface steepness in the quantum well structure 40 and a reduced defect density, so that the infrared light-receiving device 1 has good light-receiving characteristics.

The outline of a method for producing the semiconductor stack 10 and the infrared light-receiving device 1 according to the embodiment will be described below.

Figure 3:
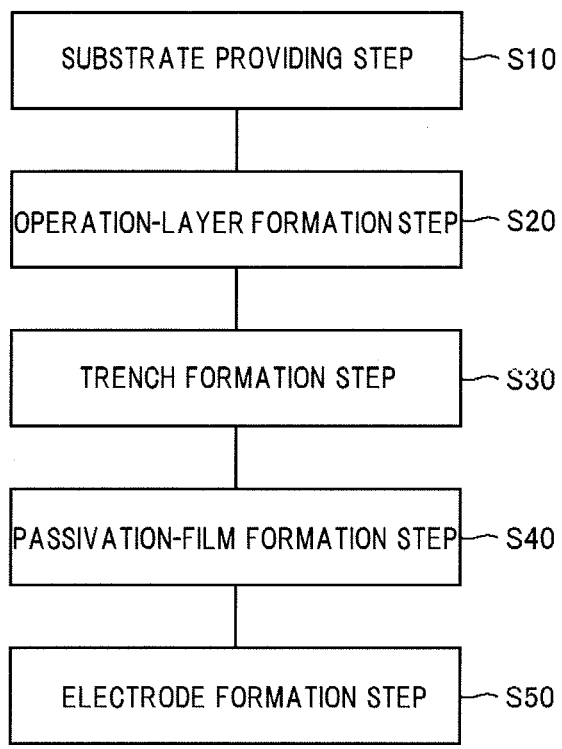
FIG. 3 is a flow chart illustrating the outline of a method for producing a semiconductor stack and a light-receiving device according to the first embodiment.
Figure 4:
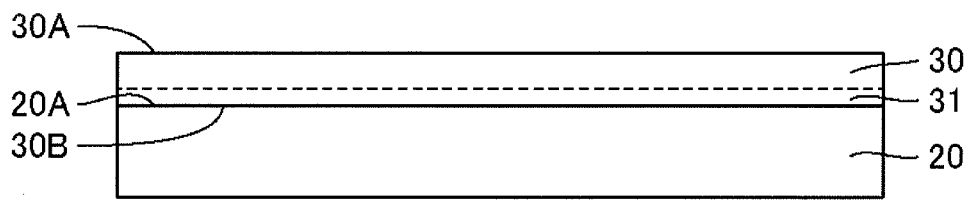
FIG. 4 is a schematic cross-sectional view illustrating the method for producing a semiconductor stack and a light-receiving device according to the first embodiment.

As illustrated in FIG. 3, in the method for producing the semiconductor stack 10 and the infrared light-receiving device 1 according to the embodiment, a substrate providing step is first performed as step S10. As illustrated in FIG. 4, in step S10, for example, the substrate 20 that has a diameter of 2 inches (50.8 mm) and that is composed of GaSb is provided. More specifically, an ingot composed of GaSb is sliced to provide the substrate 20 composed of GaSb. The substrate 20 is subjected to surface polishing and then to processes including washing, thereby providing the substrate 20 that has the main surface 20A having good flatness and good cleanliness.

Subsequently, an operation-layer formation step is performed as step S20. In step S20, an operation layer including the buffer layer 30, the quantum well structure 40, and the contact layer 50 is formed on the main surface 20A of the substrate 20 provided in step S10. The operation layer can be formed by, for example, metal-organic vapor deposition. The operation layer can be formed by the metal-organic vapor deposition in the following manner: for example, the substrate 20 is placed on a rotary table equipped with a heater for heating a substrate, and then source gases are supplied onto the substrate while the substrate 20 is heated by the heater.

Specifically, as illustrated in FIG. 4, the buffer layer 30 composed of p-GaSb, which is a III-V group compound semiconductor, is formed by metal-organic vapor deposition so as to be in contact with the main surface 20A of the substrate 20. In the formation of the buffer layer 30 composed of p-GaSb, examples of a Ga source material that can be used include triethylgallium (TEGa) and trimethylgallium (TMGa). Examples of an Sb source material that can be used include trimethylantimony (TMSb), triethylantimony (TESb), triisopropylantimony (TIPSb), tris(dimethylamino)antimony (TDMASb), and tri-tert-butylantimony (TTBSb). When C is added as a p-type impurity, for example, carbon tetrabromide ($CBr_4$) or carbon tetrachloride ($CCl_4$) can be added to source gases.

In the step of forming the buffer layer 30, one or both of Si and C are introduced in high concentrations compared with another region of the buffer layer 30 at the initial stage of the growth, thereby forming the high-concentration region 31. Specifically, for example, in order to introduce one or both of Si and C in desired concentrations at the initial stage of the growth, for example, tetraethylsilane (TeESi) serving as a Si source gas and $CBr_4$ serving as a C source gas are supplied in appropriate concentrations (flow rates). Thereby, the buffer layer 30 including the high-concentration region 31 is formed.

Figure 5:
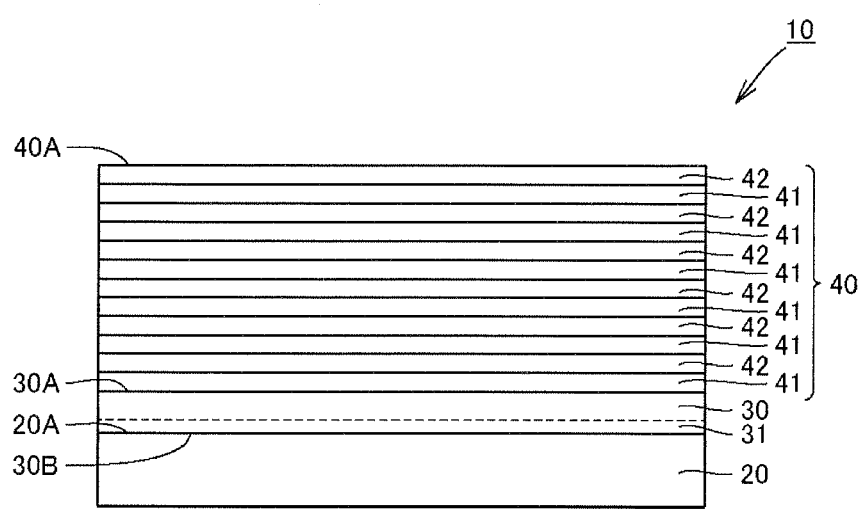
FIG. 5 is a schematic cross-sectional view illustrating the method for producing a semiconductor stack and a light-receiving device according to the first embodiment.

As illustrated in FIGS. 4 and 5, the quantum well structure 40 is formed by alternately stacking the first element layer 41 composed of, for example, InAs serving as a III-V group compound semiconductor and the second element layer 42 composed of, for example, GaSb serving as a III-V group compound semiconductor so as to be in contact with the first main surface 30A of the buffer layer 30 opposite the side facing the substrate 20. The quantum well structure 40 can be formed by metal-organic vapor deposition subsequent to the formation of the buffer layer 30. That is, the formation of the quantum well structure 40 can be performed by changing the source gases while the substrate 20 is placed in an apparatus used for the formation of the buffer layer 30.

In the formation of the first element layer 41 composed of InAs, examples of an In source material that can be used include trimethylindium (TMIn) and triethylindium (TEIn). Examples of an As source material that can be used include tert-butylarsine (TBAs) and trimethylarsine (TMAs). The first element layer 41 and the second element layer 42 can be formed in such a manner that each of the layers has a thickness of, for example, 3 nm and that, for example, 100 unit structures each formed of the first element layer 41 and the second element layer 42 are stacked. Thereby, the quantum well structure 40 serving as a type-II quantum well can be formed.

As illustrated in FIGS. 5 and 1, the contact layer 50 composed of, for example, n-InAs serving as a III-V group compound semiconductor is formed so as to be in contact with the main surface 40A of the quantum well structure 40 opposite the side facing the buffer layer 30. The contact layer 50 can be formed by metal-organic vapor deposition subsequent to the formation of the quantum well structure 40. That is, the formation of the contact layer 50 can be performed by changing the source gases while the substrate 20 is placed in the apparatus used for the formation of the quantum well structure 40. When Si is added as an n-type impurity, for example, TeESi can be added to the source gases.

The semiconductor stack 10 according to the embodiment is completed through the foregoing procedure. As described above, because step S20 is performed by metal-organic vapor deposition, the production efficiency of the semiconductor stack 10 can be improved. Step S20 is not limited to a step by a metal-organic vapor deposition method using only metal-organic sources and may be performed by an metal-organic vapor deposition method using hydrides such as $AsH_3$ (arsine) serving as an As source material and $SiH_4$ (silane) serving as a Si source material. Furthermore, step S20 can be performed by a method other than metal-organic vapor deposition, for example, a molecular beam epitaxy (MBE) method.

Figure 6:
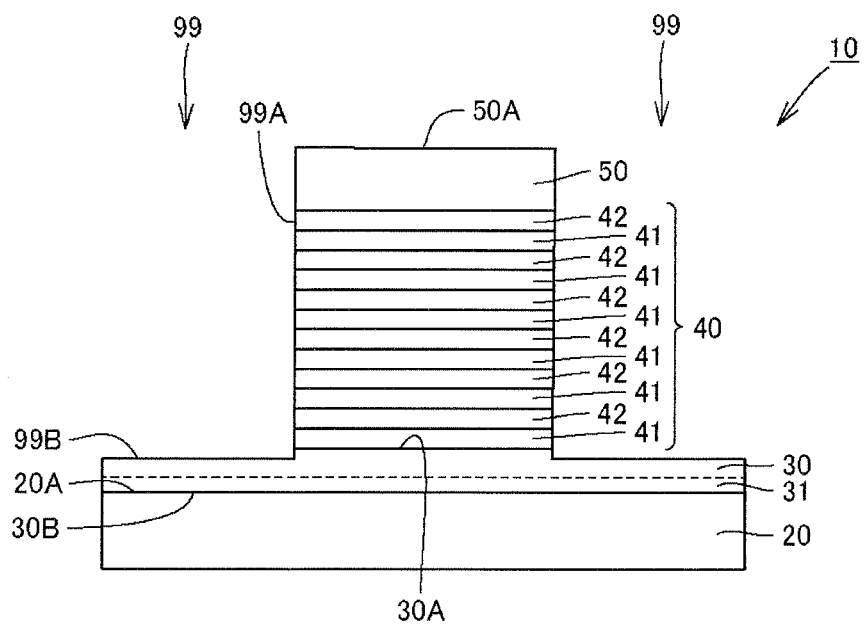
FIG. 6 is a schematic cross-sectional view illustrating the method for producing a semiconductor stack and a light-receiving device according to the first embodiment.

As illustrated in FIG. 3, a trench formation step is performed as step S30. In step (S30), as illustrated in FIGS. 1 and 6, the trenches 99 are formed in the semiconductor stack 10 produced through steps S10 and S20, each of the trenches 99 extending through the contact layer 50 and the quantum well structure 40 to the buffer layer 30. The trenches 99 can be formed by, for example, forming a mask layer on the main surface 50A of the contact layer 50, the mask having openings corresponding to the shape of the trenches 99, and then performing etching.

Figure 7:
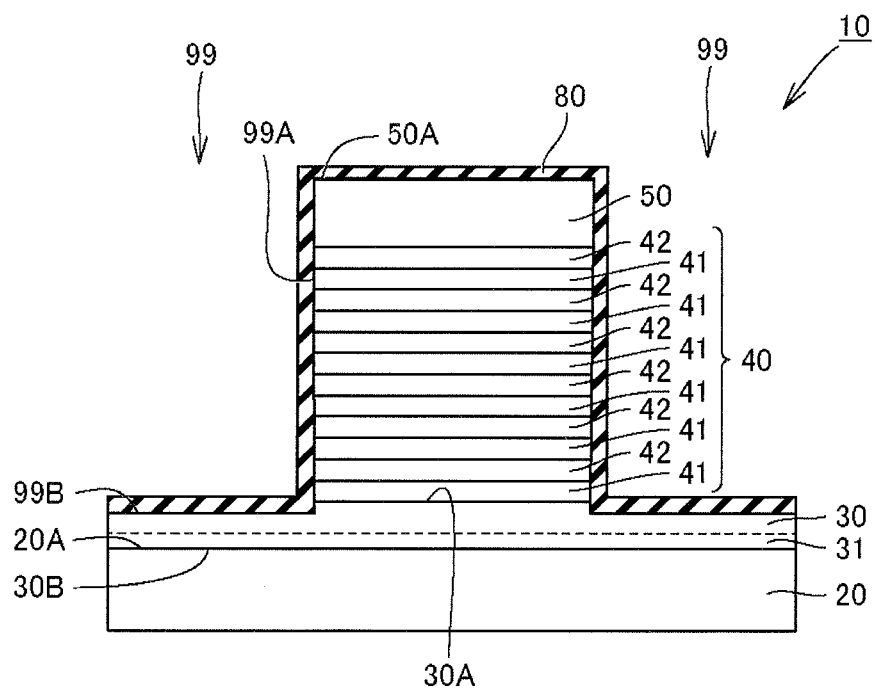
FIG. 7 is a schematic cross-sectional view illustrating the method for producing a semiconductor stack and a light-receiving device according to the first embodiment.

Next, a passivation-film formation step is performed as step S40. In step S40, as illustrated in FIGS. 6 and 7, the passivation film 80 is formed on the semiconductor stack 10 in which the trenches 99 have been formed in step S30. Specifically, the passivation film 80 composed of an insulating material such as silicon oxide or silicon nitride is formed by, for example, chemical vapor deposition (CVD). The passivation film 80 is formed so as to cover the bottom walls 99B of the trenches 99, the side walls 99A of the trenches 99, and the main surface 50A of the contact layer 50 opposite the side facing the quantum well structure 40.

Subsequently, an electrode formation step is performed as step S50. In step S50, as illustrated in FIGS. 7 and 2, the p-side electrode 91 and the n-side electrode 92 are formed on the semiconductor stack 10 in which the passivation film 80 has been formed in step S40. Specifically, for example, a mask having openings at positions corresponding to regions where the p-side electrode 91 and the n-side electrode 92 are to be formed is formed on the passivation film 80. The opening portions 81 and 82 are formed in the passivation film 80 with the mask. The p-side electrode 91 and the n-side electrode 92 composed of appropriate conductive materials are formed by, for example, an evaporation method. The infrared light-receiving devices 1 according to the embodiment are thus completed through the foregoing steps. Then, the resulting infrared light-receiving devices are divided by, for example, dicing into individual devices.

Second Embodiment

Figure 8:
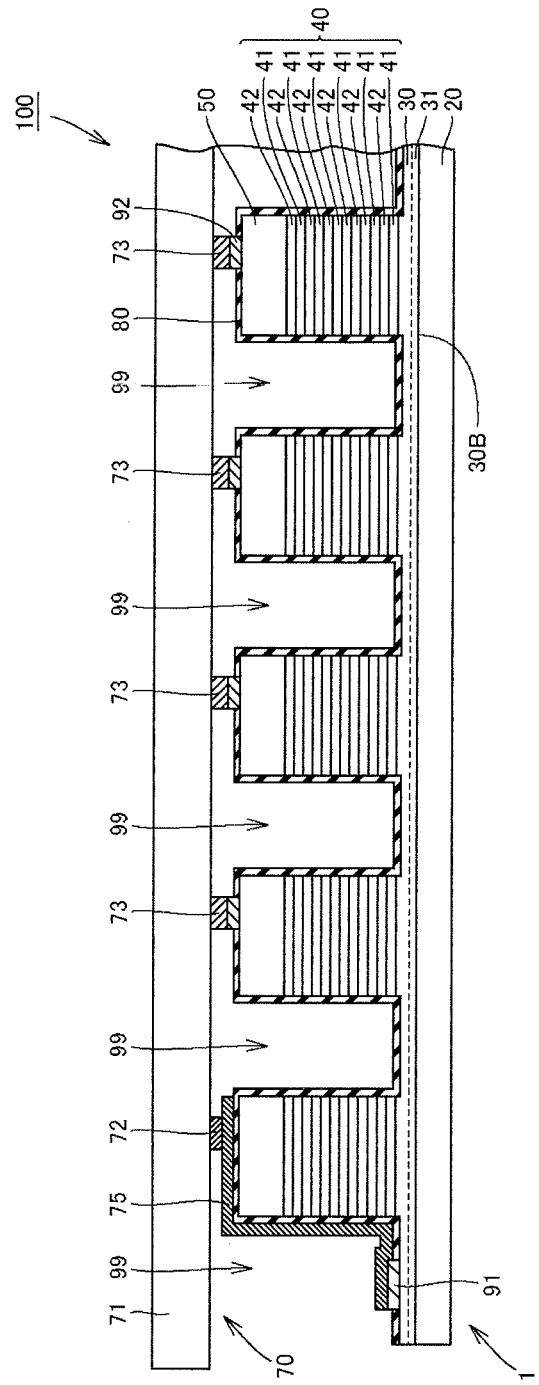
FIG. 8 is a schematic cross-sectional view of a structure of a light-receiving device and a sensor according to a second embodiment.

A light-receiving device and a sensor, which are of another embodiment of a semiconductor device, according to a second embodiment of the present invention will be described below. As illustrated in FIGS. 8 and 2, the infrared light-receiving device 1 of the second embodiment has a structure in which the unit structures each illustrated in FIG. 2 are arranged in a direction in which the one main surface 20A of the substrate 20 extends in FIG. 2. The infrared light-receiving device 1 includes the n-side electrodes 92 corresponding to pixels. In contrast, only a single p-side electrode 91 is arranged.

More specifically, as illustrated in FIG. 8, the p-side electrode 91 in the infrared light-receiving device 1 of the second embodiment is arranged on the bottom wall of the trench 99 located at an end in a direction in which the substrate 20 extends. The n-side electrode 92 located on the contact layer 50 adjoining the trench 99 located at the end is omitted. An infrared sensor 100 of the embodiment includes the infrared light-receiving device 1 having the structure and a read-out integrated circuit (ROIC) 70 electrically connected to the infrared light-receiving device 1. The read-out integrated circuit 70 is, for example, a complementary metal oxide semiconductor (CMOS) circuit.

Read-out electrodes (not illustrated) arranged on a main body 71 of the read-out integrated circuit 70 are electrically connected to the n-side electrodes 92, respectively, functioning as pixel electrodes in the infrared light-receiving device 1 through bumps 73. The infrared light-receiving device 1 also includes a lead 75 that is in contact with the p-side electrode 91, that extends along the bottom wall and the side wall of the trench 99 at which the p-side electrode 91 is located, and that extends to the top of the contact layer 50. The lead 75 is electrically connected to a ground electrode (not illustrated) arranged on the main body 71 of the read-out integrated circuit 70 through a bump 72. In this structure, light reception information for each pixel of the infrared light-receiving device 1 is output from a corresponding one of the n-side electrodes 92 (pixel electrodes) to a corresponding one of the read-out electrodes of the read-out integrated circuit 70. The light reception information sets are collected by the read-out integrated circuit 70 to provide, for example, a two-dimensional image.

Example 1

An experiment was performed in order to examine the effect of the formation of a high-concentration region in a buffer layer. An experimental procedure is as follows: a sample was produced in the same procedure as in the first embodiment, the sample including the buffer layer 30 on the one main surface 20A, which is the (001) face, of the substrate 20 composed of GaSb, the buffer layer 30 being composed of GaSb, containing C as a p-type impurity, and having a thickness of 500 nm. At the initial stage of the growth of the buffer layer 30, a Si source gas was supplied to form the high-concentration region 31 (example). For comparison purposes, a sample in which the formation of the high-concentration region 31 was omitted was also produced (comparative example). The first main surface 30A of the buffer layer 30 (a main surface opposite the side facing the substrate 20) of each of the samples of the example and the comparative example was observed with an atomic force microscope (AFM). The observation results are illustrated in FIGS. 9 to 12.

Figure 9:
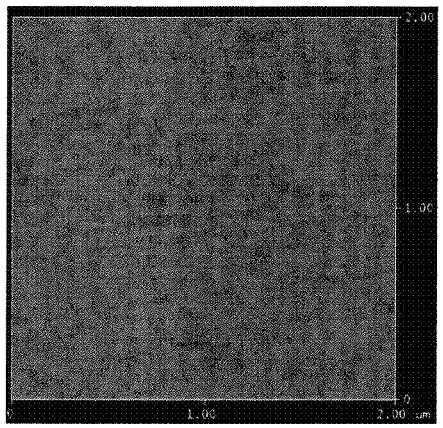
FIG. 9 is an AFM image of a 2 μm×2 μm square region of a surface of a buffer layer (example).
Figure 10:
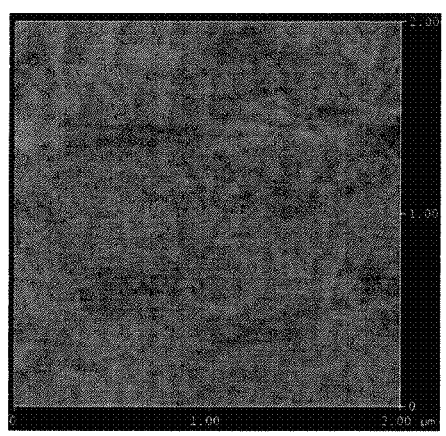
FIG. 10 is an AFM image of a 2 μm×2 μm square region of a surface of a buffer layer (comparative example).
Figure 11:
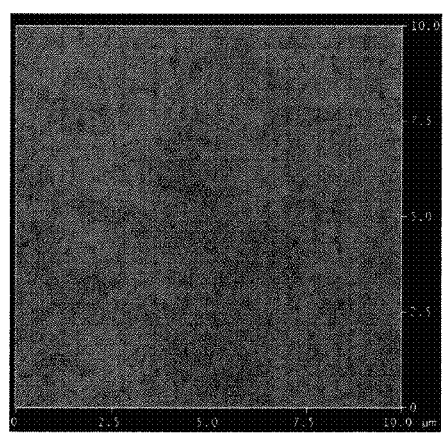
FIG. 11 is an AFM image of a 10 μm×10 μm square region of a surface of a buffer layer (example).
Figure 12:
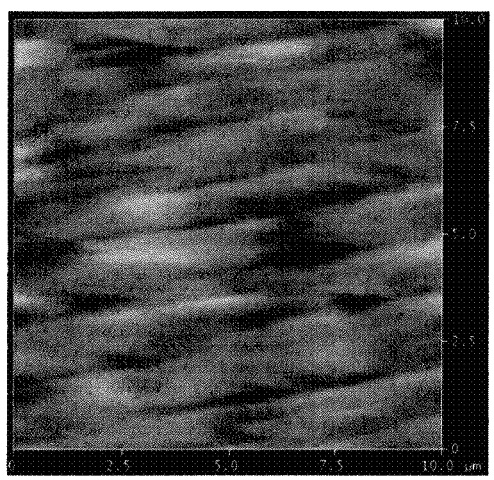
FIG. 12 is an AFM image of a 10 μm×10 μm square region of a surface of a buffer layer (comparative example).

FIG. 9 is an AFM image of a 2 µm×2 µm square region of the sample of the example. FIG. 10 is an AFM image of a 2 µm×2 µm square region of the sample of the comparative example. As illustrated in FIGS. 9 and 10, an irregular region of atomic steps is observed in the sample of the comparative example (FIG. 10), whereas regular atomic steps are observed in the sample of the example. The region of FIG. 9 has a root-mean-square (RMS) roughness of 0.13 nm. The region of FIG. 10 has an RMS roughness of 0.22 nm. FIG. 11 is an AFM image of a 10 µm×10 µm square region of the sample of the example. FIG. 12 is an AFM image of a 10 µm×10 µm square region of the sample of the comparative example. As illustrated in FIGS. 11 and 12, surface irregularities are clearly observed in the sample of the comparative example (FIG. 12), whereas regular atomic steps and good flatness are observed in the sample of the example even in the wide range of the 10 µm×10 µm square region. The region of FIG. 11 has an RMS roughness of 0.12 nm. The region of FIG. 12 has an RMS roughness of 0.73 nm. The experimental results indicate that the formation of the high-concentration region in the buffer layer enables the buffer layer to have a good surface flatness.

Example 2

A sample was produced in the same procedure as in the first embodiment, the sample including the buffer layer 30 on the substrate 20 composed of GaSb and the quantum well structure 40 on the buffer layer 30, the buffer layer 30 being compose of GaSb, containing the high-concentration region 31, and having a thickness of 100 nm. The quantum well structure 40 had 100 repeat units each having a stacked structure that includes a 3.5-nm-thick InAs layer, a 6-nm-thick GaSb layer, and a 0.5-nm-thick strain compensation layer composed of $InSb_{0.7}As_{0.3}$. The growth temperature of the quantum well structure 40 was 475° C. The quantum well structure 40 can be used as a light-receiving layer with a cutoff wavelength of 6.8 µm. The resulting sample was cut along a plane parallel to the thickness direction (stacking direction), and then the resulting cross section was observed with a transmission electron microscope (TEM). The observation results are illustrated in FIG. 13.

Figure 13:
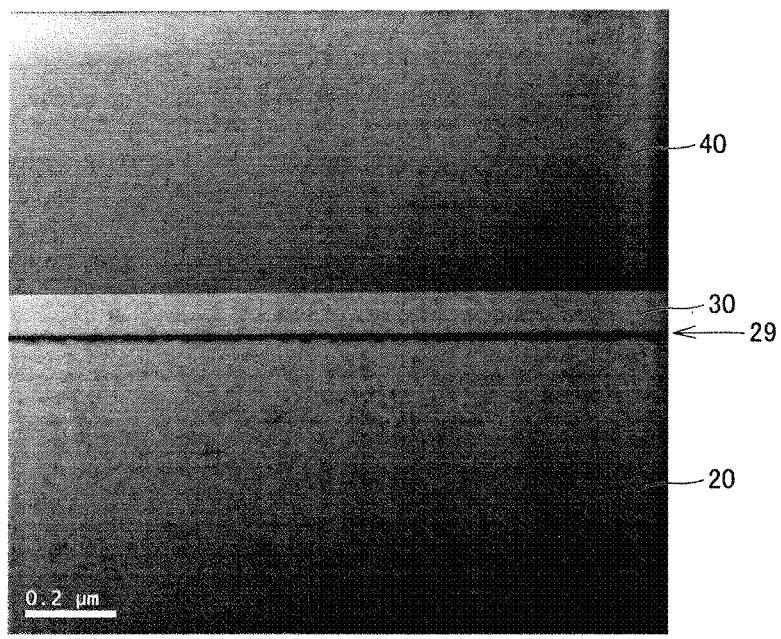
FIG. 13 is a TEM image of a cross section of a semiconductor stack along a plane of parallel to the stacking direction.

FIG. 13 indicates that the quantum well structure 40 having a good crystallinity. The reason for this is presumably that the quantum well structure 40 was formed on the buffer layer 30 having a good surface flatness that was obtained by containing the high-concentration region. An oxidized region 29 having a different contrast is present in the vicinity of the interface between the substrate 20 and the buffer layer 30 (it seems to be observed as a different contrast region that reflects the oxidized region and strain associated therewith). Because a surface of the substrate 20 composed of GaSb is easily oxidized, although common thermal cleaning was performed before the growth of the buffer layer 30 and the quantum well structure 40 on the substrate 20, the oxidized region was seemingly left.

Figure 14:
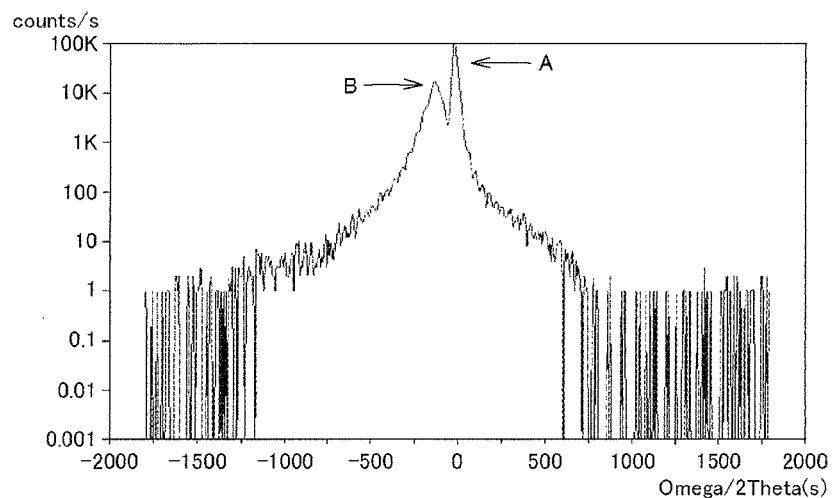
FIG. 14 illustrates the results of the XRD analysis of a semiconductor stack including a substrate and a buffer layer.

FIG. 14 illustrates the results of the X-ray diffraction (XRD) analysis of a semiconductor stack including the substrate 20 and the buffer layer 30. In FIG. 14, the horizontal axis corresponds to the angle of the X-ray, and the vertical axis corresponds to the diffraction intensity of the X-ray. In FIG. 14, peak A corresponds to the substrate 20, peak B corresponds to the buffer layer 30. Despite the fact that the substrate 20 and the buffer layer 30 are composed of an identical material (GaSb), peak B corresponding to the buffer layer 30 is observed at a position different from peak A corresponding to the substrate 20. The reason for this is presumably that the oxidized region is left in the one main surface 20A of the substrate 20 and thus information about the substrate 20 is not completely transmitted to the buffer layer 30.

Figure 15:
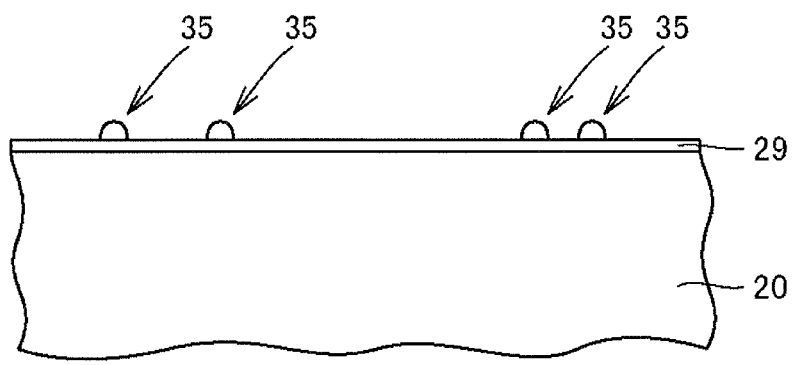
FIG. 15 is a schematic cross-sectional view illustrating the growth mechanism of a buffer layer having a good surface flatness.
Figure 16:
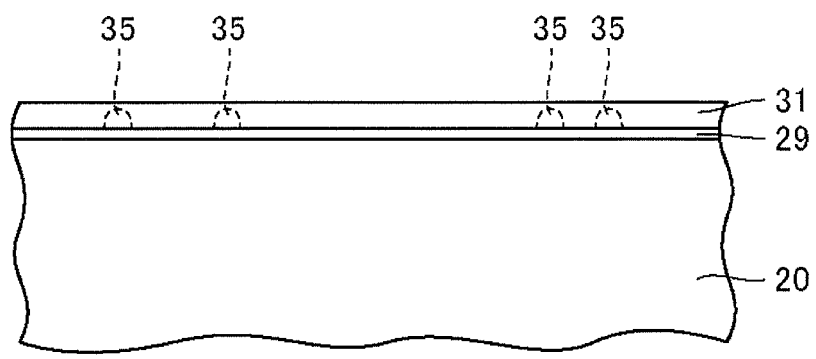
FIG. 16 is a schematic cross-sectional view illustrating the growth mechanism of a buffer layer having a good surface flatness.
Figure 17:
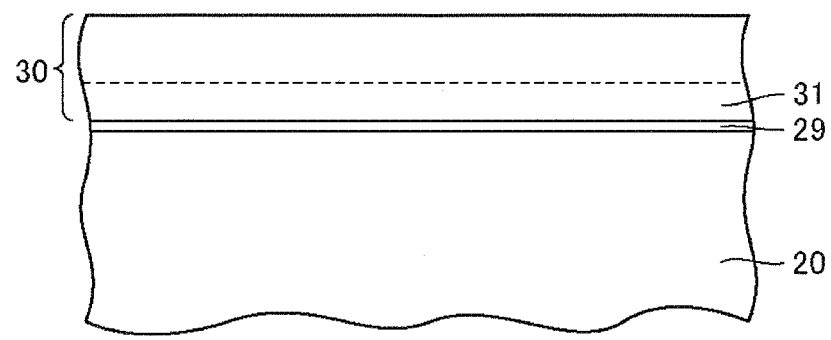
FIG. 17 is a schematic cross-sectional view illustrating the growth mechanism of a buffer layer having a good surface flatness.

As described above, despite the fact that the oxidized region 29 is left on the surface of the substrate 20, the formation of the high-concentration region 31 enables the buffer layer 30 having a good surface flatness to be formed. This can be seemingly attributed to, for example, a mechanism described below. As illustrated in FIG. 15, when the high-concentration region 31 is formed while the oxidized region 29 is left on the surface of the substrate 20, crystal nuclei 35 containing Si and C are easily formed on the oxidized region 29. As illustrated in FIG. 16, crystals grow two-dimensionally from the crystal nuclei 35, thereby forming the high-concentration region 31. In the case of a low degree of lattice mismatch between the substrate 20 and the buffer layer 30, smoother transition to the two-dimensional growth is provided. As illustrated in FIG. 17, the buffer layer 30 having a good surface flatness is formed by growing a region other than the high-concentration region 31.

Example 3

An experiment to examine an effect obtained by removing an oxidized region on a substrate surface was performed. Specifically, samples were produced in the same procedure as in the first embodiment, each of the samples including the buffer layer 30 on the substrate 20 composed of GaSb, the buffer layer 30 being composed of GaSb, containing the high-concentration region 31, and having a thickness of 500 nm. Before the growth of the buffer layer 30, the samples were subjected to thermal cleaning serving as pretreatment at 500° C. (commonly used temperature), 550° C., or 600° C. The first main surface 30A of the buffer layer 30 (a main surface opposite the side facing the substrate 20) of each of the samples was observed with a Nomarski differential interference microscope.

Figure 18:
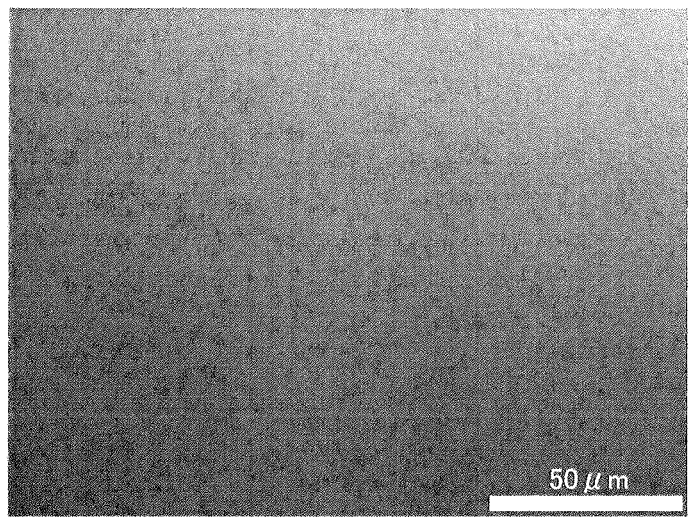
FIG. 18 is a Nomarski differential interference micrograph of a surface of a buffer layer at a pretreatment temperature of 500° C.
Figure 19:
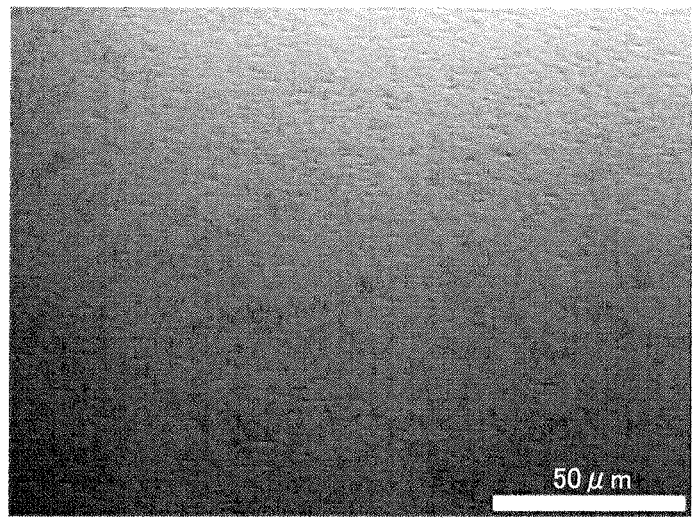
FIG. 19 is a Nomarski differential interference micrograph of a surface of a buffer layer at a pretreatment temperature of 550° C.
Figure 20:
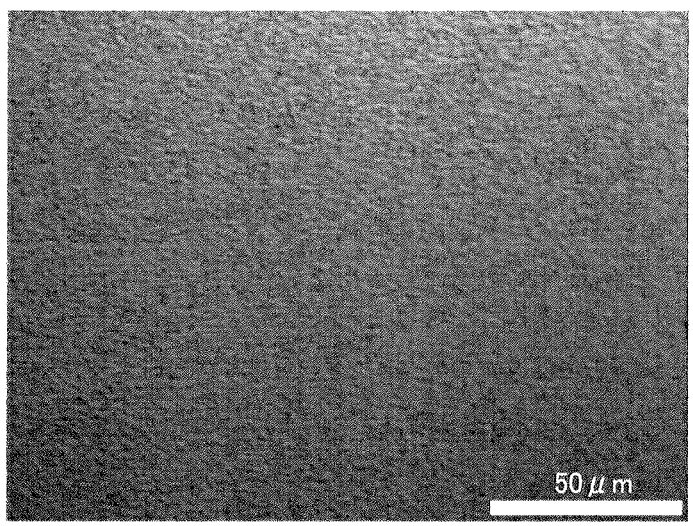
FIG. 20 is a Nomarski differential interference micrograph of a surface of a buffer layer at a pretreatment temperature of 600° C.

FIGS. 18, 19, and 20 correspond to the samples subjected to the pretreatment at a pretreatment temperature of 500° C., 550° C., and 600° C., respectively. The removal of the oxidized region seems to proceed as the pretreatment temperature increases. That is, it is speculated that the sample of FIG. 18 had the highest oxygen concentration at the interface between the substrate 20 and the buffer layer 30, the sample of FIG. 19 had a lower oxygen concentration, and that the sample of FIG. 20 had the lowest oxygen concentration.

However, as is clear from FIGS. 18 to 20, the samples having lower oxygen concentrations due to higher pretreatment temperatures have rougher surfaces. The results demonstrate that the fact that the removal of the oxidized region is allowed to proceed by increasing the pretreatment temperature has an adverse effect on an improvement in surface flatness. The reason for this is presumably as follows: For example, although the removal of the oxidized region was allowed to proceed by increasing the pretreatment temperature, GaSb contained in the substrate 20 was decomposed to cause Sb, which is easily deposited on a surface, to cluster, and then three-dimensional growth occurred from the clustered Sb.

The foregoing experimental results demonstrate that even when the oxidized region is left, the use of the buffer layer including the high-concentration region results in a good surface flatness, compared with the case where the removal of the oxidized region of the substrate is allowed to proceed by increasing the pretreatment temperature. With regard to the surface flatness of the buffer layer, for example, the 10 μm×10 μm square region has an RMS roughness of 0.4 nm or less, and the 2 μm×2 μm square region has an RMS roughness of 0.2 nm or less.

The embodiments and the examples disclosed herein are to be considered in all respects as illustrative and not limiting. The scope of the invention is defined not by the foregoing description but by the following claims, and is intended to include any modifications within the scope and meaning equivalent to the scope of the claims.

INDUSTRIAL APPLICABILITY

The semiconductor stack and the semiconductor device of the present invention are particularly advantageously used for a semiconductor stack and a semiconductor device that require buffer layers having an improved surface flatness.

REFERENCE SIGNS LIST 1 infrared light-receiving device, 10 semiconductor stack, 20 substrate, 20A one main surface, 29 oxidized region, 30 buffer layer, 30A first main surface, 30B second main surface, 31 high-concentration region, 35 crystal nucleus, 40 quantum well structure, 40A main surface, 41 first element layer, 42 second element layer, 50 contact layer, 50A main surface, 70 read-out integrated circuit, 71 main body, 72 bump, 73 bump, 75 lead, 80 passivation film, 81 opening portion, 82 opening portion, 91 p-side electrode, 92 n-side electrode, 99 trench, 99A side wall, 99B bottom wall, 100 infrared sensor

The invention claimed is:
1. A semiconductor stack comprising:
a substrate composed of a III-V group compound semiconductor;
a buffer layer arranged on the substrate, the buffer layer being composed of a III-V group compound semiconductor; and an active layer arranged on the buffer layer, the active layer including a layer composed of a III-V group compound semiconductor containing Sb as a group V element, wherein a region of the buffer layer including a main surface of the buffer layer adjacent to the substrate includes a high-concentration region having a high total concentration of Si and C compared with another adjacent region.

2. The semiconductor stack according to claim 1, wherein the high-concentration region has a total concentration of Si and C of $5\times10^{18}$ cm$^{-3}$ or more.

3. The semiconductor stack according to claim 2, wherein the high-concentration region has a Si concentration of $5\times10^{18}$ cm$^{-3}$ or more.

4. The semiconductor stack according to claim 1, wherein the high-concentration region has a total concentration of Si and C of $5\times 10^{20}$ cm$^{-3}$ or less.

5. The semiconductor stack according to claim 1, wherein the high-concentration region has a thickness of 2 nm or more and 50 nm or less.

6. The semiconductor stack according to claim 1, wherein a region of the substrate including a main surface of the substrate adjacent to the buffer layer includes an oxidized region having a high oxygen concentration compared with another adjacent region of the substrate.

7. The semiconductor stack according to claim 6, wherein the oxidized region has an oxygen concentration of $1\times10^{18}$ cm$^{-3}$ or more and $1\times10^{21}$ cm$^{-3}$ or less.

8. The semiconductor stack according to claim 1, wherein a degree of lattice mismatch between the substrate and a region of the buffer layer other than the high-concentration region of the buffer layer is 0.2% or less.

9. The semiconductor stack according to claim 1, wherein the substrate and the buffer layer are composed of an identical III-V group compound semiconductor.

10. The semiconductor stack according to claim 9, wherein the III-V group compound semiconductor contained in the substrate and the buffer layer is GaSb, InP, GaAs, or InAs.

11. The semiconductor stack according to claim 1, wherein the active layer has a quantum well structure.

12. The semiconductor stack according to claim 1, wherein the buffer layer is formed by a metal-organic vapor deposition method.

13. A semiconductor device comprising:
the semiconductor stack according to claim 1; and
an electrode arranged on the semiconductor stack.

* * * * *